(12) United States Patent
Lin et al.

(10) Patent No.: US 7,172,970 B2
(45) Date of Patent: Feb. 6, 2007

(54) POLISH METHOD FOR SEMICONDUCTOR DEVICE PLANARIZATION

(75) Inventors: Zong Huei Lin, Taichung (TW); Art Yu, Kaohsiung (TW); Chia Rung Hsu, Chang-Hua Shien (TW); Teng-Chun Tsai, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 112 days.

(21) Appl. No.: 10/384,641

(22) Filed: Mar. 11, 2003

(65) Prior Publication Data

US 2004/0180546 A1 Sep. 16, 2004

(51) Int. Cl.
*H01L 21/461* (2006.01)
*H01L 21/469* (2006.01)

(52) U.S. Cl. .................. 438/692; 438/787; 438/791

(58) Field of Classification Search ............ 438/692, 438/693, 700, 738, 740, 424
See application file for complete search history.

(56) References Cited

U.S. PATENT DOCUMENTS

| | | | | |
|---|---|---|---|---|
| 5,923,993 A | * | 7/1999 | Sahota | 438/427 |
| 5,985,762 A | * | 11/1999 | Geffken et al. | 438/687 |
| 6,001,730 A | * | 12/1999 | Farkas et al. | 438/627 |
| 6,060,370 A | * | 5/2000 | Hsia et al. | 438/424 |
| 6,153,935 A | * | 11/2000 | Edelstein et al. | 257/773 |
| 6,350,690 B1 | * | 2/2002 | Schwartz et al. | 438/690 |
| 6,593,240 B1 | * | 7/2003 | Page | 438/692 |

* cited by examiner

*Primary Examiner*—Ha Tran Nguyen
(74) *Attorney, Agent, or Firm*—Arent Fox PLLC (57) ABSTRACT

A polish method for planarization is disclosed. The method uses a combination of a traditional oxide CMP and HSP-CMP (High Selectivity and Planarization) with a fix abrasive pad to meet the requirements of the CMP process for a device feature dimension under 0.18 micron even to 0.09 micron. By using a first polish step with a conventional polish pad and an oxide polish slurry, the non-uniformity of the over-fill thickness of the STI dielectric layer can be firstly removed and a much more smooth and uniform topography favorable for the HSP-CMP process the fix abrasive polishing pad can be obtained. Then the HSP-CMP process with the fix abrasive polishing pad can be performed to provide a planarized surface with accurate dimension control.

42 Claims, 6 Drawing Sheets

POLISH METHOD FOR SEMICONDUCTOR DEVICE PLANARIZATION

BACKGROUND OF THE INVENTION

1. Field of the Invention

The present invention relates to a method for planarization, and more particularly to a two-steps polish method for planarization.

2. Description of the Related Art

Figure 1A:
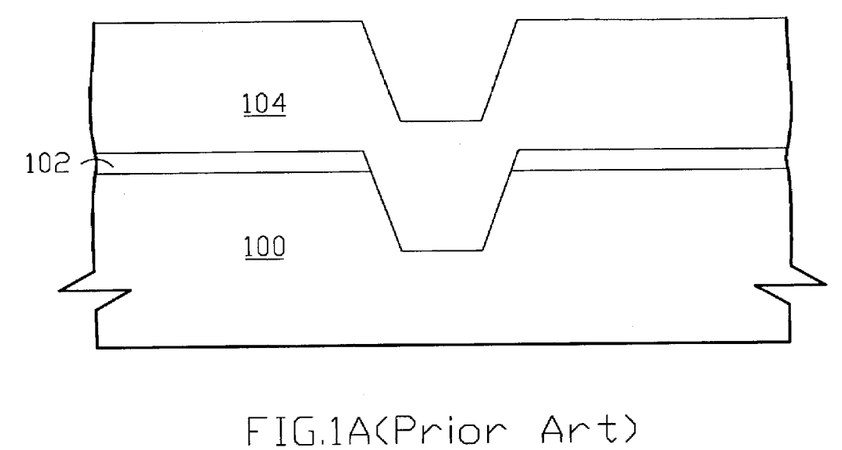
FIG. 1A shows a re-fill oxide layer formed over a substrate.
Figure 1B:
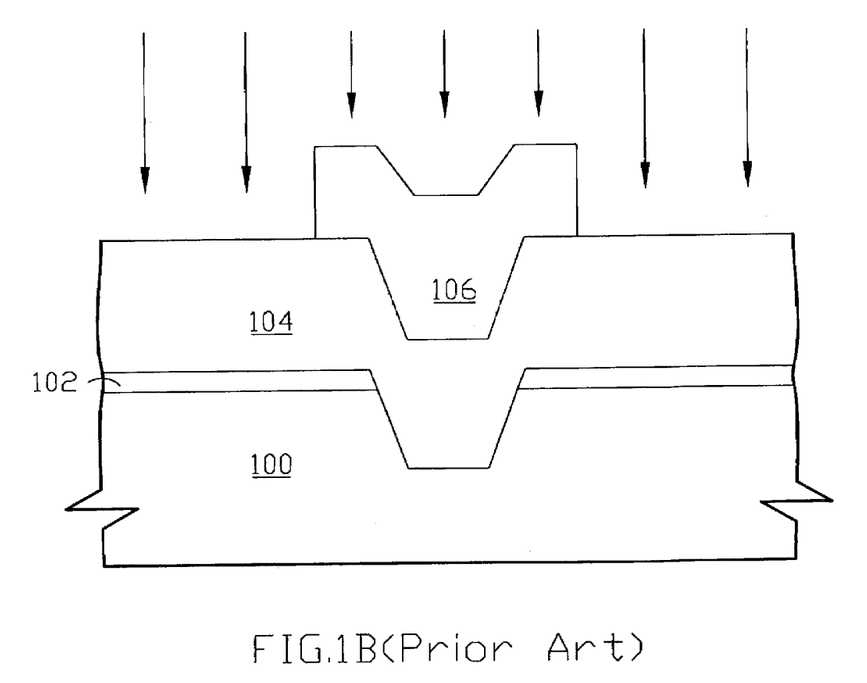
FIG. 1B shows a photoresist layer patterned by a reverse mask process to define a STI.
Figure 1C:
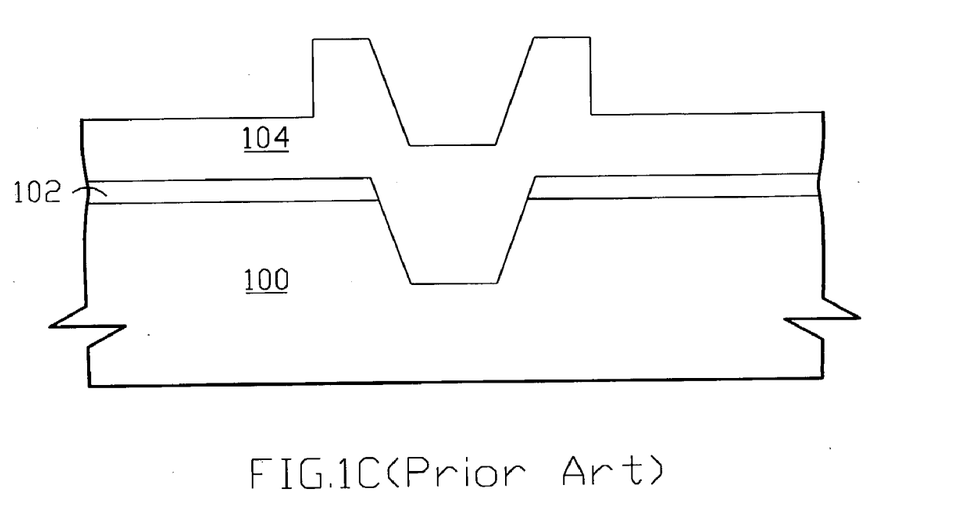
FIG. 1C shows a result of etching the re-fill oxide layer to a predetermined thickness.
Figure 1D:
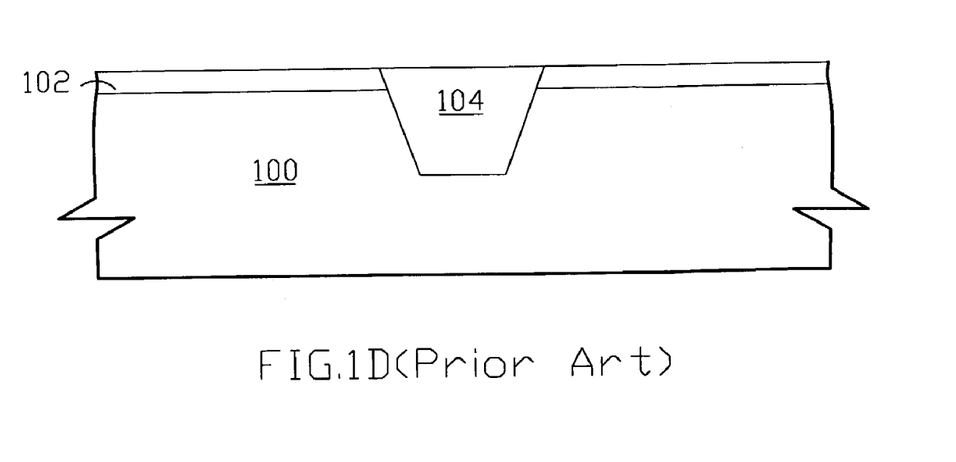
FIG. 1D shows a result of planarizing the re-fill oxide layer to expose the dielectric layer.

Since modern semiconductor technologies have progressed into deep submicron generation, chemical mechanical polishing (CMP) processes have became a crucial planarization process. One of the applications of the CMP process is applied in the formation of shallow trench isolation (STI). However, even though a modern CMP process could provide a satisfactory performance in the processes of device features with a critical dimension above 0.25 micron, it still could not meet the requirement of processes of device features with a critical dimension under 0.18 micron since the device features are such tiny and the accuracy of the processes must be highly and carefully controlled. To increase process margin, present CMP processes cannot be solely applied in the process of STI with a dimension under 0.18 micron without using other assistant technologies and equipments such as additional etching processes and reverse masks. FIG. 1A to FIG. 1D show a conventional CMP process for a STI planarization. As shown in FIG. 1A, a re-fill oxide layer 104 is conformally formed over a substrate 100 having a trench therein and a dielectric layer 102 thereon. Then as shown in FIG. 1B, a photoresist layer 106 is formed and is patterned by a reverse mask process to define a STI. Next as shown in FIG. 1C, the re-fill oxide layer 104 is anisotropically etched to a predetermined thickness. Finally, the re-fill oxide layer 104 is planarized to expose the dielectric layer 102 by a CMP process as shown in FIG. 1D.

However, the conventional CMP process for a STI planarization shown in FIG. 1A to FIG. 1D still has several advantages even though it is one of the few practical solutions of tiny feature planarization issues. For example, the use of the reverse mask and additional etching process would increase production cost and process complexity, and the composite process would gradually not be suitable for the process of tiny device features with continuously shrinking line width and increasing pattern density.

Figure 2A:
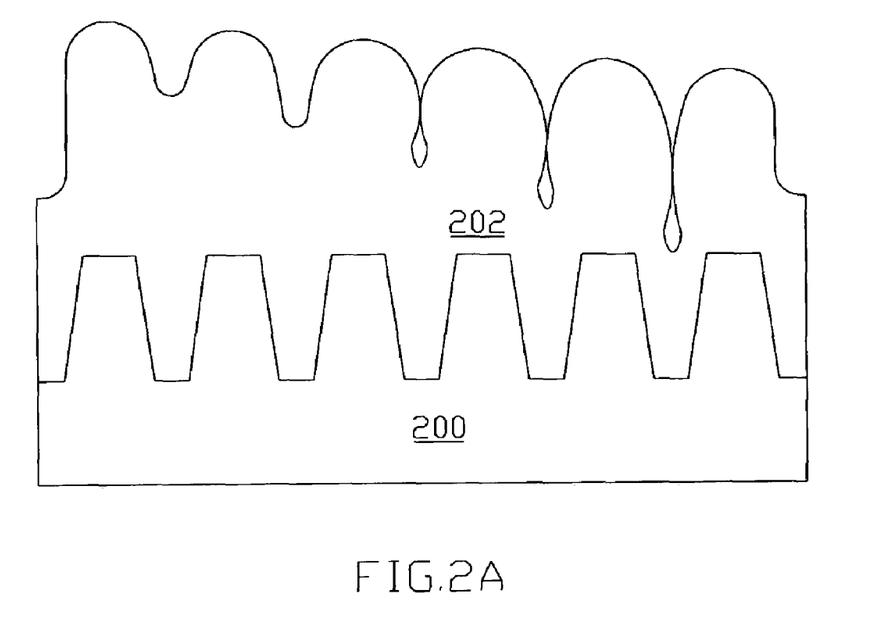
FIG. 2A shows a variation of an over-fill thickness of a re-fill oxide layer at the edge of a chip.
Figure 2B:
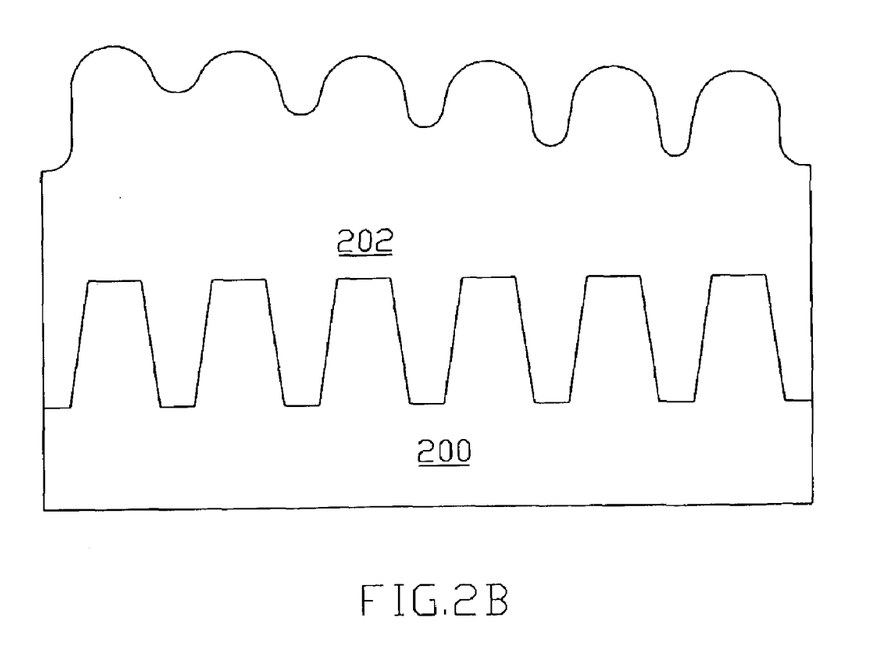
FIG. 2B shows a variation of an over-fill thickness of a re-fill oxide layer at the center of a chip.

The performance of planarization of conventional CMP processes is limited by the thickness control of the re-fill oxide layer. Especially, when the trench size is about deep submicron level, the performance of planarization of conventional CMP processes would be degraded by the variation of the over-fill thickness of the re-fill oxide layer since the thickness control of the re-fill oxide layer is tough. As shown in FIG. 2A and FIG. 2B, the over-fill thickness of a re-fill oxide layer 202 over a trench usually presents apparent variety at the edge (FIG. 2A) and the center (FIG. 2B) of a chip. The re-fill oxide layer 202 even presents vacancy over a trench without a over-fill thickness. The non-uniformity of the over-fill thickness of the re-fill oxide layer 202 would render the planarization capability of the CMP process failure.

Thus it is necessary to provide a new method to improve the planarization capability of modern CMP processes, meanwhile, maintains simplicity and low cost of the CMP processes. It is towards those goals that the present invention is specifically directed.

SUMMARY OF THE INVENTION

It is therefore an object of the invention to provide a CMP process with high capabilities of selectivity and planarization.

It is another object of this invention to provide a low cost and simplified CMP process.

It is a further object of this invention to provide a practical CMP process for a device feature dimension under 0.18 micron even to 0.09 micron.

To achieve these objects, and in accordance with the purpose of the invention, the invention use a two-steps polish method for shallow trench isolation planarization. The two-steps polish method comprises the following steps. A substrate having a first layer thereon and a second layer on said first layer is provided. Then a first chemical mechanical polishing process is performed to decrease a thickness difference value between a highest point and a lowest point of said second layer to a first predetermined thickness difference value. Next a second chemical mechanical polishing process is performed to further decrease said first predetermined thickness difference value to a second predetermined thickness difference value, wherein said second chemical mechanical polishing process has a polish selectivity higher than a polish selectivity and of said first chemical mechanical polishing process.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow and structure. The present invention can be practiced in conjunction with various fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

In one embodiment of this invention, the planarization method of this invention is applied to the planarization of shallow trench isolations. A first chemical mechanical polishing process is firstly used to decrease a thickness difference value between a highest point and a lowest point of a layer being polished to a first predetermined thickness difference value. Then a second chemical mechanical polishing process is utilized to further decrease the first predetermined thickness difference value to a second predetermined thickness difference value, wherein the second chemical mechanical polishing process has a polish selectivity and higher than a polish selectivity of the first chemical mechanical polishing process.

Figure 3A:
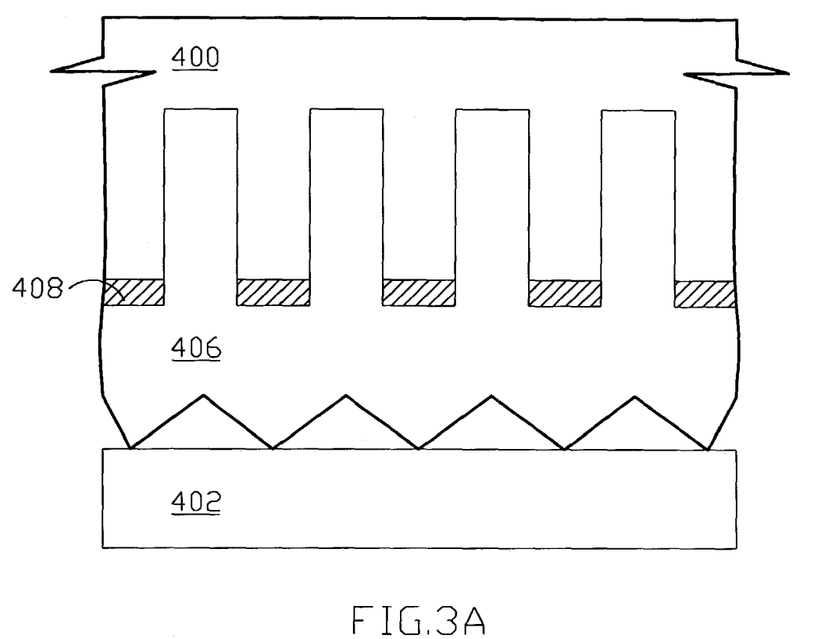
FIG. 3A shows a polish pad utilized to polish a dielectric layer filling into trenches of a substrate.

Referring to FIG. 3A, a polish pad 402 and an oxide slurry (not shown) are utilized to polish a dielectric layer 406 filling into trenches of a substrate 400. It is noted that the substrate 400 is held upside down during polishing. The substrate 400 comprises a silicon wafer and the dielectric layer 406 formed by a deposition process such as a chemical vapor deposition process comprises a silicon dioxide layer. The silicon dioxide layer is preferably formed by a high-density plasma chemical vapor deposition process (HD-PCVD). The substrate 400 also has a dielectric layer 408 thereon. The dielectric layer 408 comprises a silicon nitride layer and it is used as polish stop layer. The dielectric layers 406 and 408 are chose to has a high polish selectivity which is a ratio of the removal rates of the dielectric layers 406 and 408. The polish selectivity between the dielectric layers 406 and 408 is preferably larger than 10. The dielectric layer 406 also over-fills the trenches of the substrate 400 and presents a top surface with an irregular topography. The use of the polish pad 402 and the oxide slurry is to relieve the hardness of the fine thickness control of the dielectric layer 406 and the lowest point of the topography of the dielectric layer 406 is not necessary at the same level with the upper edge of the trench. The CMP machine used to polish the dielectric layer 406 comprises a rotary CMP machine, an orbital CMP machine, a linear CMP machine. The oxide slurry comprises a silicon dioxide slurry, for example, Cabot SS-25, or an alumina ($Al_2O_3$) slurry.

Figure 3B:
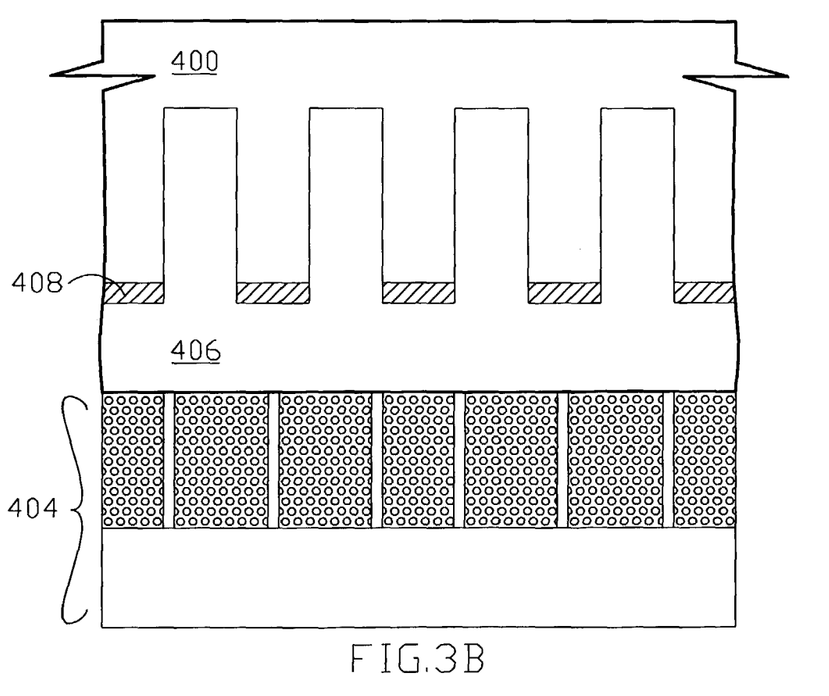
FIG. 3B shows the result of removing irregularity of the topography of the dielectric layer and applying a fix abrasive pad to continually polish the dielectric layer.

Referring to FIG. 3B, the irregularity of the topography of the dielectric layer 406 is removed and the dielectric layer 406 is continually polished by a high selectivity and planarization CMP. The high selectivity and planarization CMP preferably utilizes a fix abrasive pad 404 and an additive may be added. The additive comprises an oxide slurry, KOH solution and $NH_4OH$ solution. The additive comprises an oxide slurry, acid solution and oxidizer solution. The oxide slurry comprises a silicon dioxide slurry, for example, Cabot SS-25. In addition, a $CeO_2$ slurry can also be utilized instead of an oxide slurry. In addition, an $Al_2O_3$ slurry can also be utilized. The CMP machine used to polish the dielectric layer 406 comprises a rotary CMP machine, an orbital CMP machine, a linear CMP machine. After polishing the irregularity of the topography of the dielectric layer 406, the new surface of the dielectric layer 406 is now much more favorable for the polish with the fix abrasive pad 404. If the dielectric layer 406 is a silicon dioxide layer, the step high or thickness difference of topography of the dielectric layer 406 could be about 4300 angstroms when the device dimension is about 0.13 micron. The step high or thickness difference of topography of the dielectric layer 406 could be about 5000 angstroms when the device dimension is about 0.09 micron. The high selectivity and planarization CMP should not be applied until the thickness difference of topography of the dielectric layer 406 is decreased to about 1500 angstroms.

Figure 3C:
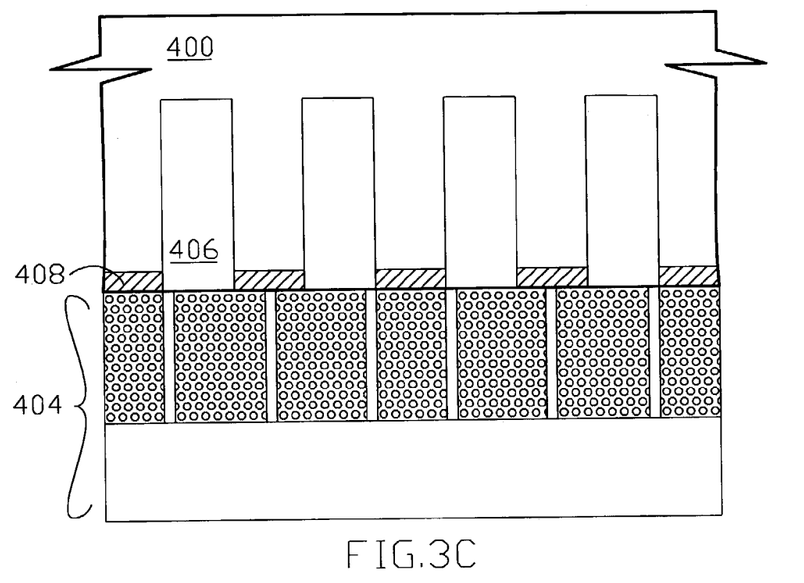
FIG. 3C shows the result of removing the over-fill dielectric layer.
Figure 4:
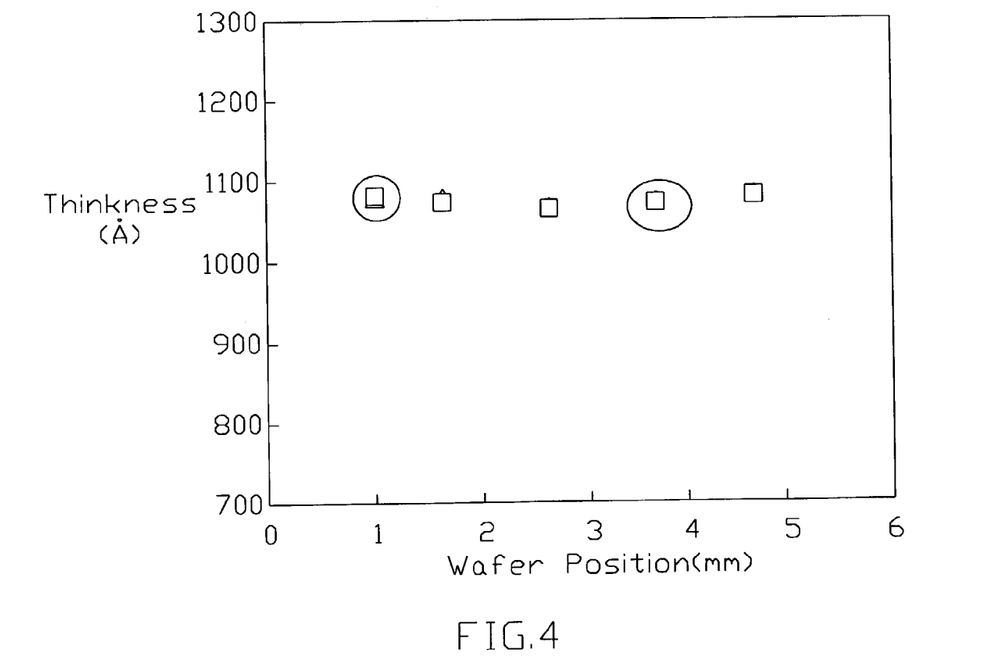
FIG. 4 shows a diagram of the thickness of a silicon nitride layer versus wafer position after a two-steps polish process of this invention is performed.

FIG. 3C shows the result of removing the over-fill dielectric layer 406. The planarization stops on the dielectric layer 408 and the two-steps polish process is accomplished. FIG. 4 shows a diagram of the thickness of a silicon nitride layer (the dielectric layer 408) versus wafer position after a two-steps polish process of this invention is performed. The thickness difference of the silicon nitride layer at wafer edge and wafer center is smaller than 50 angstroms (the thickness difference of the silicon dioxide layer (polish target) at wafer edge and wafer center is smaller than 100 angstroms) when the device dimension is about 0.09 micron. The thickness variation of topography is effectively diminished according to the result shown in FIG. 4.

Figure 5A:
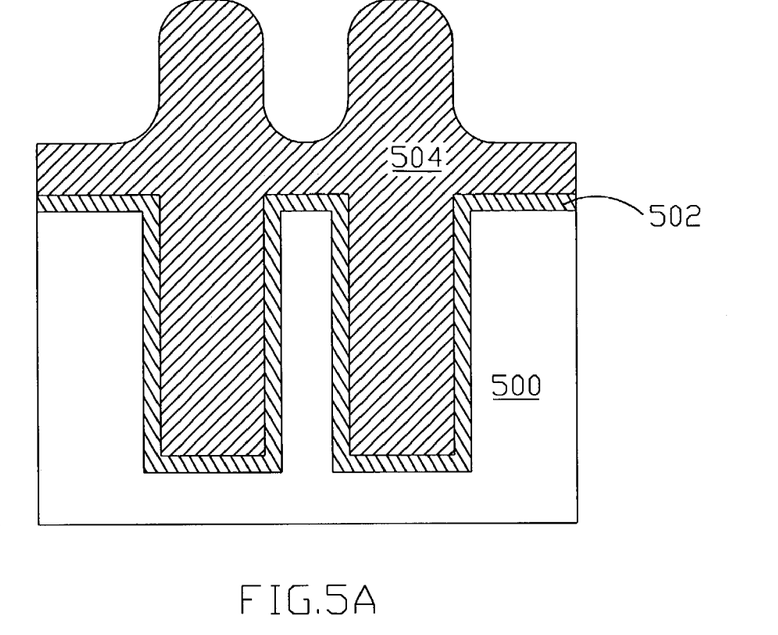
FIG. 5A shows a substrate having two trenches therein, a barrier metal layer and a metal layer thereon.

In another embodiment of this invention, the planarization method of this invention is applied to the planarization of a device structure with tiny features. Referring to FIG. 5A, a substrate 500 having two trenches therein, a barrier metal layer 502 and a metal layer 504 thereon is shown. The bulge of the metal layer 504 usually results from the tiny dimension of the trench. The barrier metal layer 502 comprises a TaN layer or a Ta layer or a TiN layer or a W(Tungsten)layer. The metal layer 504 comprises a copper layer. To planarize the metal layer 504, the polish method of this invention utilizes the polish pad 402 and an oxide slurry (not shown) to polish the metal layer 504. The irregularity of the topography of the metal layer 504 is reduced and the metal layer 504 is continually polished by a high selectivity and planarization CMP. The high selectivity and planarization CMP preferably utilizes the fix abrasive pad 404 and an additive may be added. The additive comprises an oxide abrasive slurry, acid solution and oxidizer solution. The oxide slurry comprises a silicon dioxide slurry. In addition, an $Al_2O_3$ slurry can also be utilized.

Figure 5B:
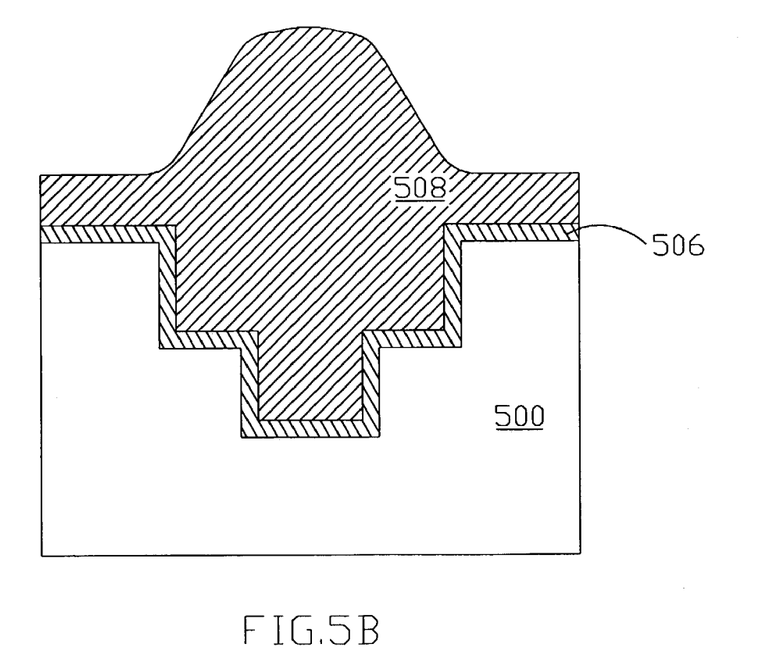
FIG. 5B shows a substrate having a dual damascene trench therein, a barrier metal layer and a metal layer thereon.

The planarization method of this invention can also be applied to the planarization of a dual damascene structure. Referring to FIG. 5B, a substrate 500 having a dual damascene trench therein, a barrier metal layer 506 and a metal layer 508 thereon is shown. The bulge of the metal layer 508 usually results from the tiny dimension of the dual damascene trench. The barrier metal layer 506 comprises a TaN layer or a Ta layer or a TiN layer or a W (Tungsten) layer. The metal layer 508 comprises a copper layer. To planarize the metal layer 508, the polish method of this invention utilizes the polish pad 402 and an oxide slurry (not shown) to polish the metal layer 508. The irregularity of the topography of the metal layer 508 is reduced and the metal layer 508 is continually polished by a high selectivity and planarization CMP. The high selectivity and planarization CMP preferably utilizes the fix abrasive pad 404 and an additive may be added. The additive comprises an oxide slurry, KOH solution and NH₄OH solution. The additive comprises an oxide slurry, acid solution and oxidizer solution. The oxide slurry comprises a silicon dioxide slurry, for example, Cabot SS-25. In addition, an $Al_2O_3$ slurry can also be utilized instead of an oxide slurry.

Due to the demands of high accuracy of such tiny device features, conventional CMP processes could not provide a satisfactory performance on the surface of a device with a tiny feature since the conventional CMP processes have dishing/erosion problems and poor topography sensitivity. The invention uses a combination of a CMP process and a HSP-CMP to meet the requirements of the CMP process for a device feature dimension under 0.18 micron even to 0.09 micron. By using a first polish step with a polish pad and an oxide polish slurry, the non-uniformity of the over-fill the STI dielectric layer or the over-fill metal layer can be firstly removed and a much more smooth and uniform topography favorable for the HSP-CMP process can be obtained. Then the HSP-CMP process can be performed to provide a planarized surface with accurate dimension control. It is noted that the polish method of planarization mentioned above should not be limited in the planarization of STI or dual damascene structure. The method of the invention can also be applied to other semiconductor devices, especially to those devices with tiny features under 0.18 micron.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A polish method for semiconductor device planarization, said method comprising:
   providing a substrate having a first layer thereon and a second layer which is a single layer by a deposition process on said first layer, wherein said first layer and said second layer are not made of same material;
   performing a first chemical mechanical polishing process to decrease a thickness difference value between a highest point and a lowest point of said second layer to a first predetermined thickness difference value without polishing said first layer; and
   performing a second chemical mechanical polishing process to further decrease said first predetermined thickness difference value to a second predetermined thickness difference value and to expose said first layer, wherein said second chemical mechanical polishing process has a polish selectivity between said first layer and said second layer higher than a polish selectivity between said first layer and said second layer of said first chemical mechanical polishing process.

2. The method according to claim 1, wherein said substrate comprises a silicon substrate having trenches therein.

3. The method according to claim 1, wherein said first layer and said second layer comprise a silicon nitride layer and a silicon dioxide layer.

4. The method according to claim 1, wherein said substrate has dual damascene trenches therein.

5. The method according to claim 1, wherein said first layer and said second layer comprise a barrier metal layer and a metal layer.

6. The method according to claim 5, wherein said barrier metal layer and said metal layer comprise a TiN layer and a copper layer.

7. The method according to claim 1, wherein said first chemical mechanical polishing process is performed by using an oxide slurry and a polish pad.

8. The method according to claim 7, wherein said oxide slurry comprises a silicon dioxide slurry.

9. The method according to claim 7, wherein said oxide slurry comprises an alumina slurry.

10. The method according to claim 1, wherein said second chemical mechanical polishing process is performed by using a fix abrasive polish pad.

11. The method according to claim 1, wherein said second chemical mechanical polishing process is performed by using a fix abrasive polish pad and an additive.

12. The method according to claim 11, wherein said additive comprises an oxide slurry, KOH solution and NH₄OH solution.

13. The method according to claim 11, wherein said additive comprises an oxide abrasive polish pad, an acid solution and an oxidizer solution.

14. The method according to claim 1, wherein said second chemical mechanical polishing process is performed by using a fix abrasive polish pad and a $CeO_2$ slurry.

15. The method according to claim 14, wherein said second chemical mechanical polishing process is performed by using a fix abrasive polish pad and an $Al_2O_3$ slurry.

16. The method according to claim 1, wherein said second chemical mechanical polishing process is performed by using a fix abrasive polish pad and an $Al_2O_3$ slurry.

17. A polish method for semiconductor device planarization, said method comprising:
   providing a substrate having a first layer thereon and a second layer which is a single layer by a deposition process on said first layer, wherein said first layer and said second layer are not made of same material;
   performing a first chemical mechanical polishing process by using an oxide slurry and a polish pad to decrease a thickness difference value between a highest point and a lowest point of said second layer to a first predetermined thickness difference value without polishing said first layer; and
   performing a second chemical mechanical polishing process to further decrease said first predetermined thickness difference value to a second predetermined thickness difference value and to expose said first layer, wherein said second chemical mechanical polishing process has a polish selectivity between said first layer and said second layer higher than a polish selectivity between said first layer and said second layer of said first chemical mechanical polishing process.

18. The method according to claim 17, wherein said substrate comprises a silicon substrate having trenches therein.

19. The method according to claim 17, wherein said first layer and said second layer comprise a silicon nitride layer and a silicon dioxide layer.

20. The method according to claim 17, wherein said substrate has dual damascene trenches therein.

21. The method according to claim 17, wherein said first layer and said second layer comprise a barrier metal layer and a metal layer.

22. The method according to claim 21, wherein said barrier metal layer and said metal layer comprise a TaN layer and a copper layer.

23. The method according to claim 17, wherein said oxide slurry comprises a silicon dioxide slurry.

24. The method according to claim 17, wherein said oxide slurry comprises an alumina slurry.

25. The method according to claim 17, wherein said second chemical mechanical polishing process is performed by using a fix abrasive polish pad.

26. The method according to claim 17, wherein said second chemical mechanical polishing process is performed by using a fix abrasive polish pad and an additive.

27. The method according to claim 26, wherein said additive comprises an oxide slurry, KOH solution and $NH_4OH$ solution.

28. The method according to claim 26, wherein said additive comprises an oxide abrasive polish pad, an acid solution and an oxidizer solution.

29. The method according to claim 17, wherein said second chemical mechanical polishing process is performed by using a fix abrasive polish pad and a $CeO_2$ slurry.

30. A polish method for semiconductor device planarization, said method comprising:
  providing a substrate having a first layer thereon and a second layer which is a single layer by a deposition process on said first layer, wherein said first layer and said second layer are not made of same material;
  performing a first chemical mechanical polishing process by using an oxide slurry and a polish pad to decrease a thickness difference value between a highest point and a lowest point of said second layer to a first predetermined thickness difference value without polishing said first layer; and
  performing a second chemical mechanical polishing process by using a fix abrasive polish pad to further decrease said first predetermined thickness difference value to a second predetermined thickness difference value and to expose said first layer.

31. The method according to claim 30, wherein said substrate comprises a silicon substrate having trenches therein.

32. The method according to claim 30, wherein said first layer and said second layer comprise a silicon nitride layer and a silicon dioxide layer.

33. The method according to claim 30, wherein said substrate has dual damascene trenches therein.

34. The method according to claim 30, wherein said first layer and said second layer comprise a barrier metal layer and a metal layer.

35. The method according to claim 34, wherein said barrier metal layer and said metal layer comprise a tungsten layer and a copper layer.

36. The method according to claim 30, wherein said oxide slurry comprises a silicon dioxide slurry.

37. The method according to claim 30, wherein said oxide slurry comprises an alumina slurry.

38. The method according to claim 30, wherein said second chemical mechanical polishing process is performed by using said fix abrasive polish pad and an additive.

39. The method according to claim 38, wherein said additive comprises an oxide slurry, KOH solution and $NH_4OH$ solution.

40. The method according to claim 38, wherein said additive comprises an oxide abrasive polish pad, an acid solution and an oxidizer solution.

41. The method according to claim 30, wherein said second chemical mechanical polishing process is performed by using said fix abrasive polish pad and a $CeO_2$ slurry.

42. The method according to claim 30, wherein said second chemical mechanical polishing process is performed by using said fix abrasive polish pad and an $Al_2O_3$ slurry.

* * * * *